United States Patent [19]

Sekiya et al.

[11] Patent Number: 4,600,968
[45] Date of Patent: Jul. 15, 1986

[54] SEMICONDUCTOR DEVICE PACKAGE HAVING REGIONS OF DIFFERENT THERMAL PROPERTIES

[75] Inventors: Tsuneto Sekiya; Osamu Matsuura; Shooichi Huruhata, all of Matsumoto, Japan

[73] Assignee: Fuji Electric Co., Ltd., Kawasaki, Japan

[21] Appl. No.: 670,751

[22] Filed: Nov. 13, 1984

[51] Int. Cl.⁴ .............................................. H05K 7/20
[52] U.S. Cl. .................... 361/394; 361/388; 357/81
[58] Field of Search ................ 357/81; 361/386, 388, 361/389, 393, 394, 396

[56] References Cited

U.S. PATENT DOCUMENTS

| 2,976,806 | 3/1961 | Risk | 361/394 |
| 3,054,024 | 9/1962 | Van Dillen | 361/393 |
| 3,267,334 | 8/1966 | Wule | 361/393 |
| 3,290,559 | 12/1966 | Kirby | 361/396 |
| 3,555,364 | 1/1971 | Matcovich | 361/394 |
| 3,723,833 | 3/1973 | Wheatley, Jr. | 361/386 |
| 4,423,465 | 12/1983 | Teng-Ching | 361/394 |

OTHER PUBLICATIONS

IBM Tech. Discl. Bull., vol. 27, No. 4B, Sep. 1984, p. 2389, "Stackable Plastic Semiconductor Chip Carrier", Robock.

Primary Examiner—G. P. Tolin
Attorney, Agent, or Firm—Brumbaugh, Graves, Donohue & Raymond

[57] ABSTRACT

In the particular embodiments of the invention described in the specification, a semiconductor package is made from two modules, one containing a semiconductor element having a high allowable temperature and the other containing a circuit component having a lower allowable temperature. The modules are combined by corresponding embossed and recessed surfaces or by pin connection or by a connecting screw.

1 Claim, 5 Drawing Figures

SEMICONDUCTOR DEVICE PACKAGE HAVING REGIONS OF DIFFERENT THERMAL PROPERTIES

BACKGROUND OF THE INVENTION

This invention relates to semiconductor devices and, more particularly, to a new and improved semiconductor device incorporating a semiconductor element such as a power transistor, thyristor or the like together with a driving circuit.

The trend is for semiconductor devices incorporating semiconductor elements and other circuit elements to be modularized. When such semiconductor elements are modularized, the transistors and thyristors, as well as driving and protective circuits which have heretofore been provided in separate printed circuit boards, are incorporated into the same package. However, this results in the following problems:

Taking a power transistor as an example, although the transistor as a semiconductor element is resistant to heat at a temperature of 150° C., a protective circuit for the transistor, such as a snubber circuit including capacitors, for instance, is resistant to heat only up to a temperature of approximately 100° C. For this reason, if they are contained in the same package, the guaranteed temperature will have to be reduced and this will decrease the operating efficiency of the semiconductor element.

Accordingly, an object of the present invention is to provide a semiconductor device which can be modularized without reducing the operating efficiency of semiconductor elements contained therein.

Another object is to provide a modularized semiconductor device having a high allowable temperature although it contains circuit elements having different allowable temperatures.

SUMMARY OF THE INVENTION

These and other objects of the invention are attained by providing a semiconductor device comprising one package containing one or more semiconductor elements, another package containing an additional circuit including circuit elements having allowable temperatures lower than those for the semiconductor elements, and an arrangement for combining both the packages.

In one arrangement for combining the packages, an emobossed portion is provided in one package and a recessed portion is formed in the other package. Alternatively, a connecting element such as a pin or screw extends through a hole in one package and engages a hole in the other package.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
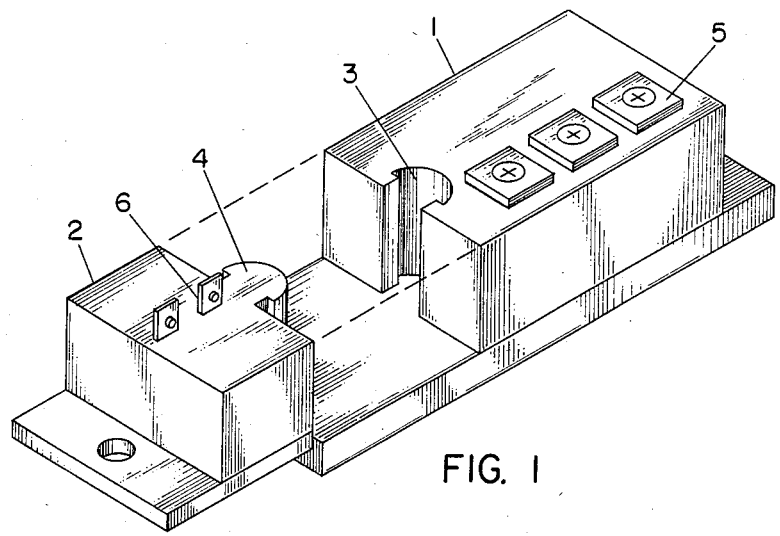
FIG. 1 is a perspective view illustrating one embodiment of a semiconductor device according to the present invention in a disassembled state.

In the representative embodiment of the invention shown in FIG. 1, a resin case 1 containing a power transistor and a resin case 2 containing an additional circuit are combined together by providing a recessed portion 3 in the case 1 and a corresponding shaped embossed portion 4 in the case 2. In order to connect the additional circuit and the power transistor, metal terminals 5, such as the emitter, base and collector terminals, are exposed on the surface of the resin case 1 so that they may be connected to appropriate conductors.

Since the resin case 1 contains no capacitor or other component having a low allowable temperature, it can be tested at high temperatures, whereas the resin case 2 containing circuit elements having low allowable temperatures must be tested at lower temperatures. The power transistors and the additional circuit may thus be separately tested and combined together later. Consequently, this arrangement is advantageous in view of the increased yield and improved device reliability. Moreover, a resin providing excellent heat resistance may be used for only the resin case 1 designed to allow for high temperatures, so that the operating efficiency of the element may be improved when the power transistor is operated at high temperatures.

Figure 2:
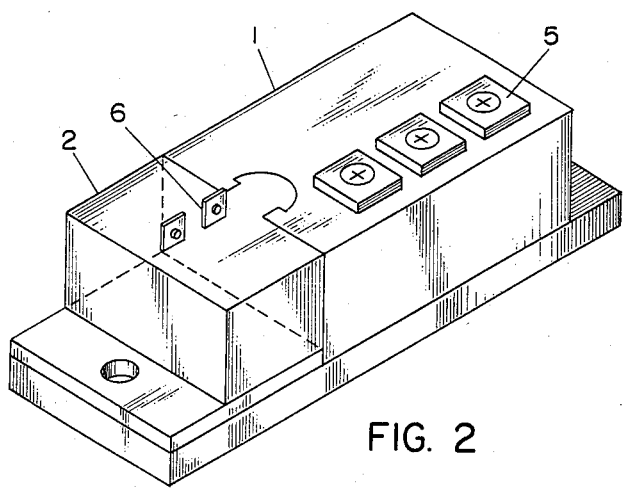
FIG. 2 is a perspective view illustrating the semiconductor device of FIG. 1 in the assembled condition.
Figure 3:
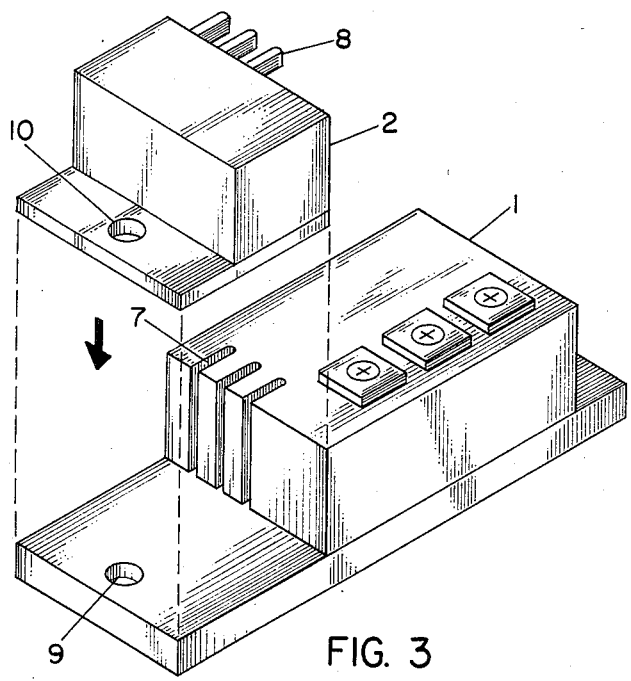

In the embodiments of FIGS. 1 and 2, the additional circuit and the power transistor are connected by wiring outside the resin case. In this case, a natural oscillation phenomenon may occur depending on the length and pattern of wiring. FIG. 3 shows an example wherein such external wiring can be dispensed with. In this embodiment, open metal slits 7 are built into the resin case 1 on the body side toward the case 2 and metal projections 8 that can be fitted into the slits are provided in the resin case 2 containing the additional circuitry. The open metal slits 7 and the metal projections 8 are arranged so as to electrically communicate with the appropriate elements within the cases so that both the cases 1 and 2 can be incorporated into a module by inserting the projections 8 into the slits 7 from the top and pinning them together using a hole 9 in the case 1 and another hole 10 in the case 2. Thus, the power transistor and the additional circuit are connected electrically and modularized at the same time without the necessity of external wiring.

Figure 4:
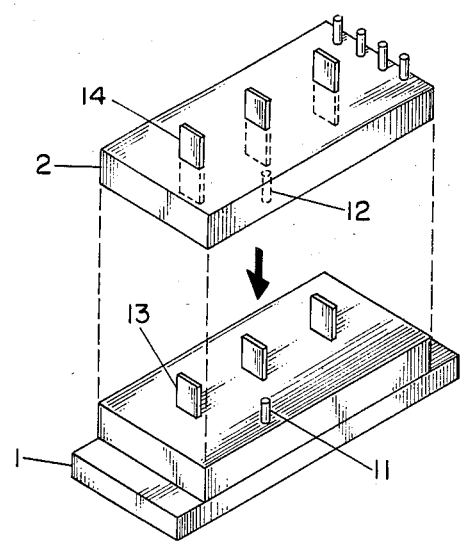
FIGS. 3, 4 and 5 are perspective views illustrating different embodiments of the present invention.

FIG. 4 shows another embodiment of the present invention wherein wiring can also be dispensed with. In this embodiment, the resin case 1 containing the transistor elements and the resin case 2 containing the additional circuit are vertically arranged and the additional circuit and the transistor elements are electrically connected by inserting a pin 11 projecting from the case 1 into a plug buried in the case 2. A main terminal 13 at the top of the transistor element is fitted into a main terminal 14 projecting from the surface of the case 2 so that an output can be obtained from the main terminal 14 at the top of the module.

Figure 5:
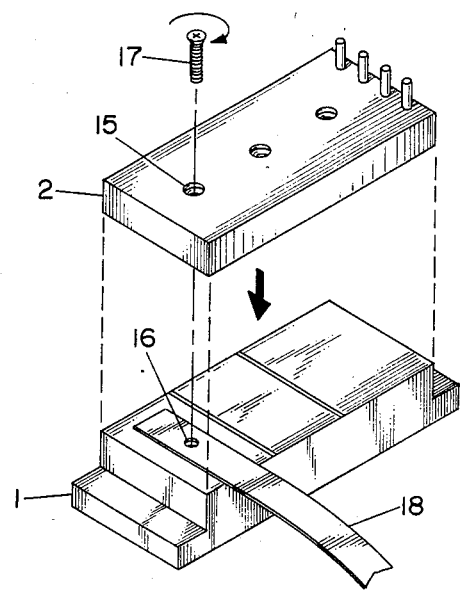

In still another embodiment of the present invention as shown in FIG. 5, the cases are combined by inserting a screw 17 through a hole 15 in the resin case 2 and then screwing it into a threaded hole 16 in the resin case 1. The connection of the elements and the additional circuit is simultaneously effected by the screw 17 and they may also be connected to an external circuit by inserting a wiring bus bar 18 between the cases.

It will be apparent from the foregoing that the present invention provides semiconductor modules including elements having high allowable temperatures and an additional circuit having low allowable temperatures together with appropriate coupling means. Accordingly, each of the constituents can be tested within its own allowable temperature range before the constituents are combined. This provides an advantageous yield, thus improving product reliability. Moreover, since the guaranteed temperature of each portion can be selected independently, the operating efficiency of the element is also increased. If the cases are arranged so as to be incorporated and simultaneously electrically connected, problems with wiring may be avoided and reliability relative to wiring connections will be improved. The problem of a natural oscillation phenomenon in case of external wiring connections can also be effectively eliminated.

We claim:

1. A semiconductive package comprising
   a first case of a first resin having a relatively high heat resistance and including semiconductive elements tolerant of relatively high operating temperatures and free of components intolerant of an operating temperature in excess of a given temperature, and
   a second case of a second resin having a relatively lower heat resistance and including semiconductive elements intolerant of operating temperatures in excess of the given temperature,
   the first case including a first set of terminals for interconnecting its components with the components in the second case,
   the second case including a second set of terminals for interconnecting its components with the components in the first case,
   one of two sets of terminals projecting from its case,
   the other of the two sets being in recessed means in its case,
   the projecting terminals removably merging with the terminals in the recessed means, electrically interconnecting the two sets of terminals and merging the two cases together to form an intimate interface between the two cases at the merger.

* * * * *